United States Patent
Kuo et al.

(10) Patent No.: US 10,169,507 B2
(45) Date of Patent: Jan. 1, 2019

(54) VARIATION-AWARE CIRCUIT SIMULATION

(71) Applicant: Taiwan Semiconductor Manufacturing Co., Ltd., Hsin-Chu (TW)

(72) Inventors: Chin-Cheng Kuo, Taoyuan (TW); Wei-Yi Hu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 30 days.

(21) Appl. No.: 15/439,794

(22) Filed: Feb. 22, 2017

(65) Prior Publication Data
US 2018/0150577 A1 May 31, 2018

Related U.S. Application Data

(60) Provisional application No. 62/427,736, filed on Nov. 29, 2016.

(51) Int. Cl.
*G06F 17/50* (2006.01)

(52) U.S. Cl.
CPC ...... *G06F 17/5036* (2013.01); *G06F 17/5022* (2013.01)

(58) Field of Classification Search
CPC .. G06F 17/5036; G06F 17/5022; G05B 17/02
See application file for complete search history.

(56) References Cited

U.S. PATENT DOCUMENTS

| | | | | |
|---|---|---|---|---|
| 6,618,837 B1* | 9/2003 | Zhang | ............... | G06F 17/5036 703/14 |
| 6,637,018 B1* | 10/2003 | Demler | ............... | G06F 17/5063 716/104 |
| 6,721,922 B1* | 4/2004 | Walters | ............... | G06F 17/5022 716/102 |
| 6,857,110 B1* | 2/2005 | Rupp | ............... | G06F 17/5045 326/44 |
| 6,968,514 B2* | 11/2005 | Cooke | ............... | G06F 17/5045 716/102 |
| 7,162,402 B2* | 1/2007 | Daems | ............... | G05B 17/02 703/13 |
| 7,243,320 B2* | 7/2007 | Chiu | ............... | G06F 17/5022 716/106 |
| 7,424,693 B2* | 9/2008 | Alter | ............... | G06F 17/5031 716/106 |
| 7,693,691 B1* | 4/2010 | Tao | ............... | G06F 17/5009 375/267 |

(Continued)

*Primary Examiner* — Naum B Levin
(74) *Attorney, Agent, or Firm* — Duane Morris LLP

(57) ABSTRACT

An integration circuit (IC) simulation method includes: (a) providing a design netlist of a system-level circuit, wherein the system-level circuit comprises a first sub-circuit; (b) providing a first behavior model that is determined based on an operation of the first sub-circuit, wherein the first behavior model is a function of one or more respective behavior-level parameters; (c) incorporating a first variation into each of the one or more behavior-level parameters of the first behavioral model; and (d) simulating the system-level circuit based on the one or more behavior-level parameters of the first behavior model that incorporates the first variation.

20 Claims, 4 Drawing Sheets

(56) References Cited

U.S. PATENT DOCUMENTS

| | | | | |
|---|---|---|---|---|
| 7,716,023 B2* | 5/2010 | Barker | ............... | G05B 17/02 |
| | | | | 382/103 |
| 8,024,682 B2* | 9/2011 | McConaghy | ....... | G06F 17/5063 |
| | | | | 716/100 |
| 8,074,189 B2* | 12/2011 | McConaghy | ....... | G06F 17/5036 |
| | | | | 700/103 |
| 8,180,621 B2* | 5/2012 | Phillips | ............... | G06F 17/5031 |
| | | | | 703/14 |
| 8,443,329 B2* | 5/2013 | McConaghy | ....... | G06F 17/5063 |
| | | | | 703/22 |
| 8,818,784 B1* | 8/2014 | Rubero | ............... | G06F 17/5022 |
| | | | | 703/14 |
| 8,893,068 B1* | 11/2014 | Kho | ............... | G06F 17/50 |
| | | | | 716/106 |
| 9,026,964 B2* | 5/2015 | Mohanty | ............. | G06F 17/5036 |
| | | | | 716/104 |
| 9,053,276 B2* | 6/2015 | Mohanty | ............. | G06F 17/5063 |
| 2005/0257178 A1* | 11/2005 | Daems | ............... | G06F 17/5045 |
| | | | | 716/51 |
| 2010/0250187 A1* | 9/2010 | Zuber | ............... | G06F 17/5036 |
| | | | | 702/179 |

\* cited by examiner

VARIATION-AWARE CIRCUIT SIMULATION

CROSS-REFERENCE TO RELATED APPLICATION

The present application claims priority to U.S. Provisional Patent Application No. 62/427,736, filed on Nov. 29, 2016, which is incorporated by reference herein in its entirety.

BACKGROUND

Typically, the design process for a new integrated circuit (IC) includes several steps using Electronic Design Automation (EDA) tools. During an initial schematic design of an (integrated) circuit, a designer identifies a set of functions to include in the initial schematic design, along with their standard delays. The designer uses computer implemented tools to perform functional simulation, to ensure that the design performs its intended function(s). Before the schematic design is laid out, the designer typically performs a pre-simulation. The pre-simulation takes into account device characteristics, to provide an estimate of circuit performance (e.g., performance in both analog and digital designs, including timing performance in digital designs). If the design meets circuit performance requirements in the pre-simulation, the designer initiates floorplan and layout phases, to generate an actual IC layout, using a place and route engine of the EDA tool. If the pre-simulation identifies significant performance issues, the designer modifies the design before proceeding to layout.

Following the layout process, the user verifies the design by using the EDA tools to perform design rule checks (DRC), layout versus schematic (LVS) checks, and RC extraction. In an example, the RC extraction tool takes into account the layout of the conductive (e.g., metal) lines of the interconnect layers generated by the router and computes parasitic resistance and capacitance elements associated with each conductive line. Subsequently, a post-simulation verifies circuit performance, taking into account the parasitic resistance and capacitance elements, in addition to the device characteristics.

With the advent of using advanced technology nodes having geometries of 40, 30, or 20 nanometers, or smaller, in a circuit, fluctuations in processing conditions (e.g., processing temperature, processing pressure, etc.) and/or environmentally conditions (e.g., a supplied voltage, an operating temperature) stochastically cause a variety of variations in device characteristics, which in turn changes the performance of the circuit. Thus, an EDA tool that considers the above-mentioned variations is needed.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
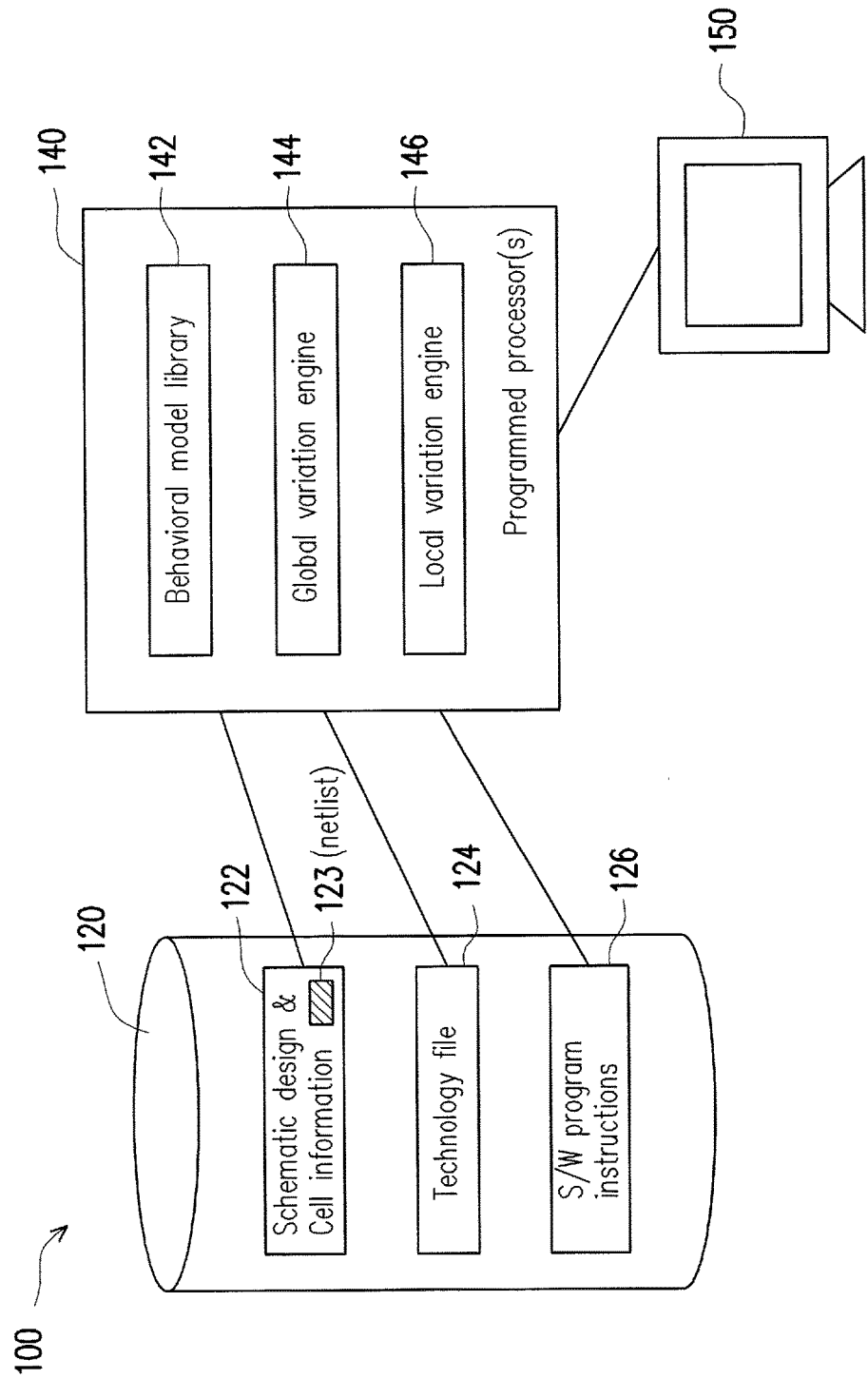
FIG. 1 illustrates an exemplary block diagram of a system to simulate a system-level circuit with consideration of variations, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of systems and methods to consider effects of a variety of variations (e.g., random mismatch between different instances of a same component (a transistor, a line, a resistor, a capacitor, etc.) due to process variations) in simulating a system-level circuit by the use of a bottom-up simulation flow. More specifically, in some embodiments, such a disclosed bottom-up simulation flow uses a behavioral model to characterize each sub-circuit that constitutes the system-level circuit, and incorporate (or "back-annotate") the variety of variations into the behavioral model as the behavioral model's respective "behavior-level parameters" (or sub-circuit level parameters). As such, each sub-circuit may be described (simulated) by its own behavioral model that is a function of respective behavior-level parameters, while simultaneously taking into account the effects of variations. Using such functions with respective behavior-level parameters, each sub-circuit may have a respective set of behavioral outputs in response to a respective set of behavioral inputs. Consequently, a system-level simulation (e.g., output response(s) of the system-level circuit) may be readily available by associating the (simulated) behavioral input(s)/output(s) of each sub-circuit based on a design of the system-level circuit (i.e., how the sub-circuits are coupled/interacted with one another). Moreover, incorporating the variation(s) into each sub-circuit's behavioral model may spontaneously cause the system-level simulation to take into account the one or more of the variations through the above-mentioned association of simulated behavioral inputs and outputs.

In some embodiments, the above-mentioned variations may be considered to take into account (i.e., incorporated into behavioral models) "globally" or "locally." When one or more variations are "globally" incorporated into a behavioral model of a sub-circuit, each of the variations may be considered as a global corner (e.g., a process corner, etc.) that corresponds to a design parameter of the sub-circuit (e.g., a voltage level, a temperature, a process variation, etc.), and the global corner may cause respective behavior-level parameters of the behavioral model to vary accordingly. As such, behavioral output(s) of each sub-circuit may vary in accordance with the global corner(s) being incorporated.

Typically, each circuit (sub-circuit) may include a variety of global corners to be considered. Each global corner of a sub-circuit may be referred to as an extreme of one of the above-mentioned design parameters within which the sub-circuit can still function properly. In some embodiments, the variety of global corners may be lumped into a smaller number of "global design corners," or "global corner" such as, for example, a fast-fast corner, a slow-slow corner, etc., that each represents an extreme of the respective sub-circuit's performance, which will be discussed in further detail below.

In some other embodiments, when one or more variations are "locally" incorporated into a behavioral model of a sub-circuit, each variation may be described based on a probability distribution of a device variable, wherein each device variable corresponds to a design parameter of an element of the sub-circuit (e.g., a channel width of a MOSFET of the sub-circuit, a channel width of a MOSFET of the sub-circuit, a threshold voltage of a MOSFET of the sub-circuit, etc.). And one or more variations (device variables) are "locally" incorporated into respective device(s)/component(s) of each sub-circuit. Accordingly, each sub-circuit's behavioral model may be constructed by respective behavior-level parameters that takes into account the device variables, and thus behavioral output(s) of each sub-circuit may take into account the device variables, which will be discussed in further detail below.

FIG. 1 is an exemplary block diagram of a system 100 for simulating a system-level circuit that globally and locally incorporates one or more variations as behavioral inputs of each sub-circuit that constitutes the system level circuit, in accordance with various embodiments.

System 100 includes at least one non-transitory, computer readable storage medium 120 for storing data representing a schematic design of a layer of an integrated circuit (IC) comprising a plurality of standard library cells for inclusion in a semiconductor substrate. Either the same storage medium 120 or a different storage medium (not shown) stores data and instructions used by electronic design automation (EDA) tool 140. As shown, the storage medium 120 includes, but are not limited to, schematic design and cell information 122, technology file 124 including variation information (described below), and software program instructions 126.

In some embodiments, the schematic design and cell information 122 includes a netlist 123 of a system-level circuit and operation parameters specified by a designer of the system-level circuit. In general, such a netlist 123 includes a plurality of sub-netlists that each corresponds to a sub-circuit, wherein the plurality of sub-circuits (sub-netlists) are inter-coupled with each other to provide one or more logic and/or analog functions that the system-level circuit is configured to perform. In some embodiments, a system-level circuit may include, but is not limited to, a system-on-chip (SoC) circuit. It is understood by people with ordinary skill in the art that an SoC circuit may include digital, analog, mixed-signal, and/or radio-frequency (RF) functions, all integrated on a single (chip) substrate. An example of such an SoC circuit is a phase-locked loop (PPL) circuit/system, which will be described in further detail below with respect to FIG. 2.

In some embodiments, a designer of the system-level circuit may construct the netlist 123 using a plurality of pre-defined behavioral models stored in the EDA tool 140 (described in further detail below with respect to FIG. 2), wherein each behavioral model is configured to describe an operation of a respective sub-circuit. In some alternative embodiments, when a netlist of a system-level circuit is not constructed using the pre-defined behavioral models, a designer may access the EDA tool 140 to construct the netlist using the behavioral models.

The technology file 124 includes variation information of the above-mentioned global corners (e.g., process corners, etc.), probability distributions of design parameters, and probability distributions of statistic parameters. Such variation information stored in the technology file 124 may be provided by each foundry that fabricates the devices/elements/lines (e.g., transistors, resistors, inductors, capacitors, interconnection lines, vias, etc.) to constitute the circuit/sub-circuit. Further, in some embodiments, the variation information may be provided to the EDA tool 102 for the (system-level/sub-) circuit simulations with simultaneously considering global corners and local mismatch variations, which will be discussed in further detail below with respect to FIGS. 3 and 4, respectively.

Generally, in semiconductor manufacturing, a process corner is an example of a design-of-experiments (DoE) technique that refers to a variation of design (process) parameters used to realize an IC design onto a semiconductor wafer/substrate. Process corners represent the extremes of these parameter variations within which a circuit that has been etched onto the wafer can still function correctly. Examples of the process corner may include a front-end-of-line (FEOL) corner and a back-end-of-line (BEOL) corner, in accordance with various embodiments of the present disclosure.

An FEOL corner is typically referred to as a corner that lumps various design parameters (in a larger amount) of a device (e.g., a MOSFET) into a smaller number of corners, as described above. In general, each MOSFET may include three lumped corners: a typical corner, a fast corner, a slow corner, which represent a typical speed of an electrical property (e.g., a carrier mobility), a fast speed of the electrical property, and a slow speed of the electrical property, respectively. As such, in an example in which the design corner represents the speed of the carrier mobility, the design corner of a sub-circuit/circuit (that includes plural MOSFET's) may be designated with a first letter (e.g., "T" stands for the typical speed, "F" stands for the fast speed, "S" stands for the slow speed, etc.) and a second letter (e.g., "T" stands for the typical speed, "F" stands for the fast speed, "S" stands for the slow speed, etc.), wherein the first and second letters are used to designate the carrier mobilities of an n-type MOSFET and a p-type MOSFET of the sub-circuit, respectively. Accordingly, a total of five corners may be used to describe global variations of a sub-circuit: a typical-typical (TT) corner (representing a typical speed of an n-type carrier mobility and a typical speed of a p-type carrier mobility), a fast-fast (FF) corner (representing a fast speed of the n-type carrier mobility and a fast speed of the p-type carrier mobility), a slow-slow (SS) corner (representing a slow speed of the n-type carrier mobility and a slow speed of the p-type carrier mobility), a fast-slow (FS) corner (representing a fast speed of the n-type carrier mobility and a slow speed of the p-type carrier mobility), and a slow-fast (SF) corner (representing a slow speed of the n-type carrier mobility and a fast speed of the p-type carrier mobility).

The above-described five corners of a sub-circuit are merely an example to lump various design parameters for a sub-circuit. In some embodiments, more or less design parameters may be lump/integrated into each of a specific set of design parameters. For example, in addition to the speeds of n-type and p-type carrier mobilities, a corner may further include a supplied voltage level, etc., of a respective sub-circuit. As such, a corner of the sub-circuit may be represented by three letters (e.g., an SSF corner of the sub-circuit representing a slow speed of the n-type carrier mobility in the sub-circuit, a slow speed of the p-type carrier mobility in the sub-circuit, and a high supplied voltage of the sub-circuit, respectively), which in turn leads to a total of ten corners, for example, a TTS corner, a TTF corner, an SFS corner, an SFF corner, an FSS corner, an FSF corner, an SSF corner, an SSS corner, an FFS corner, and an FFF corner.

In addition to the FET's operation characteristic, e.g., the carrier mobility, supplied voltage, as described above, corners on variations of interconnection lines (e.g., a VIA) may be significant, especially at the smaller technology nodes. Such corners on the variation of interconnection lines are typically referred to as the above-mentioned BEOL corners. Example of the BEOL corners include "$RC_{worst}$," and "$RC_{best}$," which represents a minimum interconnect line width/thickness and a maximum interconnect line width/thickness, respectively. Although the following discussions are directed to using the corners (e.g., the FEOL corners) for globally incorporating the variations into behavioral models, it is understood that the BEOL corners can also be used in the behavioral models while remaining within the scope of the present disclosure. Accordingly, the corner is herein referred to as a "global corner".

Regarding the information of probability distributions of design parameters and statistic parameters (hereinafter "local mismatch variations") in the technology file 124, the local mismatch variations generally include a set of variations for each type of line and/or device, at a particular technology node, wherein each variation is described as a probability distribution. More specifically, for each type of device/line, a portion of the variations may each have a respective physical meaning (e.g., a channel length/width of the device, a gate oxide thickness of the device, a threshold voltage of the device, etc.) while another portion of the variations may not have physical meanings. In some embodiments, such non-physical variations may be each used for statistical purposes. For example, given a MOSFET having nominal gate length "L," gate width "W," and/or oxide thickness "$t_{ox}$" (specified in the netlist 123 of the schematic design and cell information 122), the information of the local mismatch variations may include (physical) variations of the gate length L, gate width W, and oxide thickness $t_{ox}$, wherein each of the variations is described by a Gaussian probability distribution. In some embodiments, each of such Gaussian probability distributions may be provided by the technology file 124. More specifically, the variation of L may be described as a first probability distribution with a mean value ($\mu_L$) and a standard deviation ($\sigma_L$); the variation of W may be described as a second probability distribution with a mean value ($\mu_W$) and a standard deviation ($\sigma_W$); the variation of $t_{ox}$ may be described as a third probability distribution with a mean value ($\mu_{tox}$) and a standard deviation ($\sigma_{tox}$).

In some embodiments, the EDA tool 140 is a special purpose computer configured to retrieve stored (software) program instructions 126 from a non-transitory computer readable storage medium (e.g., 120) and execute the instructions on a general purpose processor. Examples of non-transitory computer readable storage mediums 120 include, but are not limited to, hard disk drives (HDD), read only memories ("ROM's"), random access memories ("RAM's"), flash memories, or the like.

Figure 2:
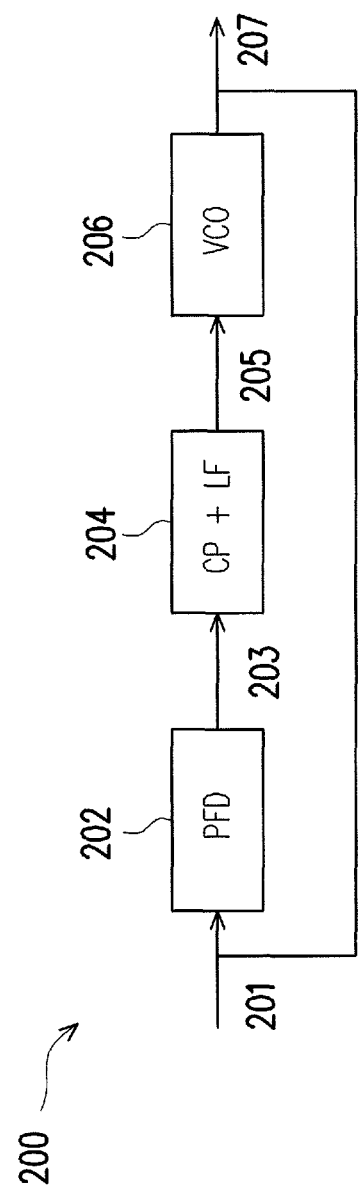
FIG. 2 illustrates an exemplary block diagram of a system-level circuit, in accordance with some embodiments.

In some embodiments, the EDA tool 102 includes a behavioral model library 142, a global variation engine 144, and a local variation engine 146. It is noted that the illustrated embodiment of the EDA tool 102 of FIG. 2 is merely an example. Therefore, one or more libraries and/or engines/models may be included in the EDA tool 102 while remaining within the scope of the present disclosure. For example, the EDA tool 102 may further include a "place a route" model/engine that is used to lay out a circuit design (e.g., the netlist 123).

The behavioral model library 142 may store a plurality of behavioral models that each describes an operation of a respective circuit (e.g., a sub-circuit of a system-level circuit), using respective behavior-level parameter(s), in response to one or more behavioral inputs (e.g., operation parameters), as mentioned above. In other words, each behavioral model may be implemented as a function of respective behavior-level parameter(s) that is configured to receive one or more behavioral inputs, and, in response to the behavioral input(s), output one or more corresponding behavioral outputs using the function. In some embodiments, such a function is determined based on operation(s)/characteristic(s) of the respective sub-circuit, and further, the function (a behavioral model of a sub-circuit) may be characterized by one or more above-mentioned behavior-level parameters such as, for example, a gain of a first sub-circuit (e.g., voltage control oscillator) in a system-level circuit, a rising time and a falling time of a second sub-circuit (e.g., a phase frequency detector) in the system-level circuit, etc. The behavioral model will be discussed in further detail with respect to an exemplary PLL system/circuit of FIG. 2.

The global variation engine 144 is configured to retrieve the netlist 123 from the schematic design and cell information 122, use the stored behavioral models (retrieved from the behavioral model library 142), and based on the information of global corners (retrieved from the technology file 124), provide one or more behavioral outputs with incorporation of the global corners, for respective sub-circuits of the netlist 123. In other words, the global variation engine 144 may cause each sub-circuit to consider the effects of global corners by incorporating the global corners into the respective behavioral model's behavior-level parameters. Accordingly, the above-mentioned behavioral-level parameters may vary in accordance with the global corner being incorporated (selected). Moreover, in some embodiments, each sub-circuit in the netlist 123 may independently and separately be selected to operate under a specific global corner. As such, each sub-circuit may serve as a building block that includes its respective behavioral input(s)/output(s) at a particular global corner, and, by associating the building blocks, one or more operation responses of the system-level circuit, with simultaneously taking into account the global corner(s) of each sub-circuit, may be derived (or simulated). Operation of the global variation engine 144 will be described in further detail below with respect to FIG. 3.

The local variation engine 146 is configured to retrieve the netlist 123 form the schematic design and cell information 122, use the stored behavioral models (retrieved from the behavioral model library 142), and based on the information of local mismatch variations (retrieved from the technology file 124), provide one or more behavioral outputs with incorporation of the local mismatch variations, for respective sub-circuits of the netlist 123. In other words, the local variation engine 146 may cause each sub-circuit to consider the effects of local mismatch variations by incorporating the local mismatch variations into the respective behavioral model's behavior-level parameter(s). Accordingly, in some embodiments, each sub-circuit in the netlist 123 may independently and separately consider its respective local mismatch variation(s). As such, the behavioral model of each sub-circuit may serve as a building block to derive (simulate) one or more operation responses of the system-level circuit while simultaneously taking into account the local mismatch variation(s) of each sub-circuit. Operation of the local variation engine 146 will be described in further detail below with respect to FIG. 4.

The system 100 also includes one or more input/output (I/O) devices 150, which can include a computing device having a display, keyboard, pointing device, touch screen, and/or the like. The EDA tool 140 prompts the user for inputs using the I/O devices 150, and the user inputs requested information and controls the operation of the EDA tool 140 using the I/O devices 150.

The EDA tool 140 indicates that one or more programmed processors may be included. In some embodiments, the processing load is performed by two or more application programs, each operating on a separate processor. In other embodiments, the processes are all performed using one processor.

Although FIG. 1 shows an allocation of the various tasks to specific modules, this is only one example. The various tasks may be assigned to different modules to improve performance, or improve the ease of programming.

FIG. 2 illustrates an exemplary block diagram of a phase-locked loop (PLL) system/circuit 200, in accordance with various embodiments. In some embodiments, the PLL circuit 200 may include a system-level circuit having plural sub-circuits coupled with one another. As shown, the PLL circuit 200 includes a phase frequency detector (PFD) 202, a charge pump (CP) and a low-pass filter (LF) 204, and a voltage control oscillator (VCO) 206. It is understood that the PLL circuit 200 is merely an example. Many other types of circuits, sub-circuits, or systems may be simulated and designed in accordance with various embodiments of the present invention.

As described above, system-level output response(s) of a system-level circuit may be derived by performing one or more (device-level or transistor-level) simulations for each sub-circuit of the system-level circuit to derive one or more respective behavior-level parameters (i.e., to derive respective behavioral models), and then based on the design of the system-level circuit (e.g., the netlist 123), associating the one or more behavioral models. The following discussion with respect to FIG. 2 will be directed to the discussion of respective behavior-level parameter(s) and corresponding behavioral model (i.e., a function described by the behavior-level parameter(s)) of each of the sub-circuits 202, 204, and 206. Further, in some embodiments, behavioral output(s) of each sub-circuit is generated based on how respective behavioral inputs respond to the function described by respective behavior-level parameter(s), which will be discussed in further detail below.

In some embodiments, to be used in a phase-locked application (e.g., the PLL circuit 200), the PFD 202 is typically considered as a digital block that is configured to receive digital clock signal 201 so as to output digital control signals 203, as the behavioral output of the PFD 202, to the serially coupled CP and LF 204. As such, the behavioral model of the PFD 202 may be described as how the digital control 203 responds to the digital clock 201 by using behavior-level parameters of the PFD 202 such as, for example, a reset time, a rising time, a falling time, a delay time of the PFD 202. Accordingly, for example, part of the behavioral model of the PFD 202 may be represented as: when the digital clock signal 201 is input as a first pattern, the PFD 202 may use the above-mentioned behavior-level parameters to output the digital control signal 203 at a first digital pattern; and when the digital clock signal 201 is input as a second pattern, the PFD 202 may use the above-mentioned behavior-level parameters to output the digital control signal 203 at a second digital pattern.

The CP and LF 204 then uses the digital control signal 203 to output a voltage control signal 205, as the behavioral output of the CP and LF 204, to the serially coupled VCO 208. As such, the behavioral model of the CP and LF 204 may be described as how the voltage control 205 responds to the digital control 201 by using behavior-level parameters of the CP and LF 204 such as, for example, an upper current level of the CP, a lower current level of the CP, a capacitance value of the LF, a resistance value of the LF. Accordingly, for example, part of the behavioral model of the CP and LF 204 may be represented as: when the digital control signal 203 includes the first digital pattern (as received from the PFD 202), the CP and LF 204 may use the respective behavior-level parameters to output the voltage control signal 205 at a first voltage level; when the digital control signal 203 includes the second digital pattern (as received from the PFD 202), the CP and LF 204 may use the respective behavior-level parameters to output the voltage control signal 205 at a second voltage level.

The VCO 206 then uses the control voltage signal 205 to output an output frequency signal 207, as the behavioral output of the VCO 206, which, in some embodiments, is also one of the output responses of the system-level PLL circuit 200. As such, the behavioral model of the VCO 206 may be described as how the output frequency signal 207 responds to the voltage control 205 by using behavior-level parameters of the VCO 206 such as, for example, a voltage-to-frequency gain of the VCO 206. For example, part of the behavioral model of the VCO 208 may be represented as: when the control voltage signal 205 is at the first voltage level (as received from the CP and LF 204), the VCO 206 uses the behavior-level parameters (e.g., the voltage-to-frequency gain) to output the output frequency signal 207 at a first value; when the control voltage signal 205 is at the second voltage level (as received from the CP and LF 204), the VCO 206 uses the behavior-level parameters (e.g., the voltage-to-frequency gain) to output the output frequency signal 207 at a second value.

Figure 3:
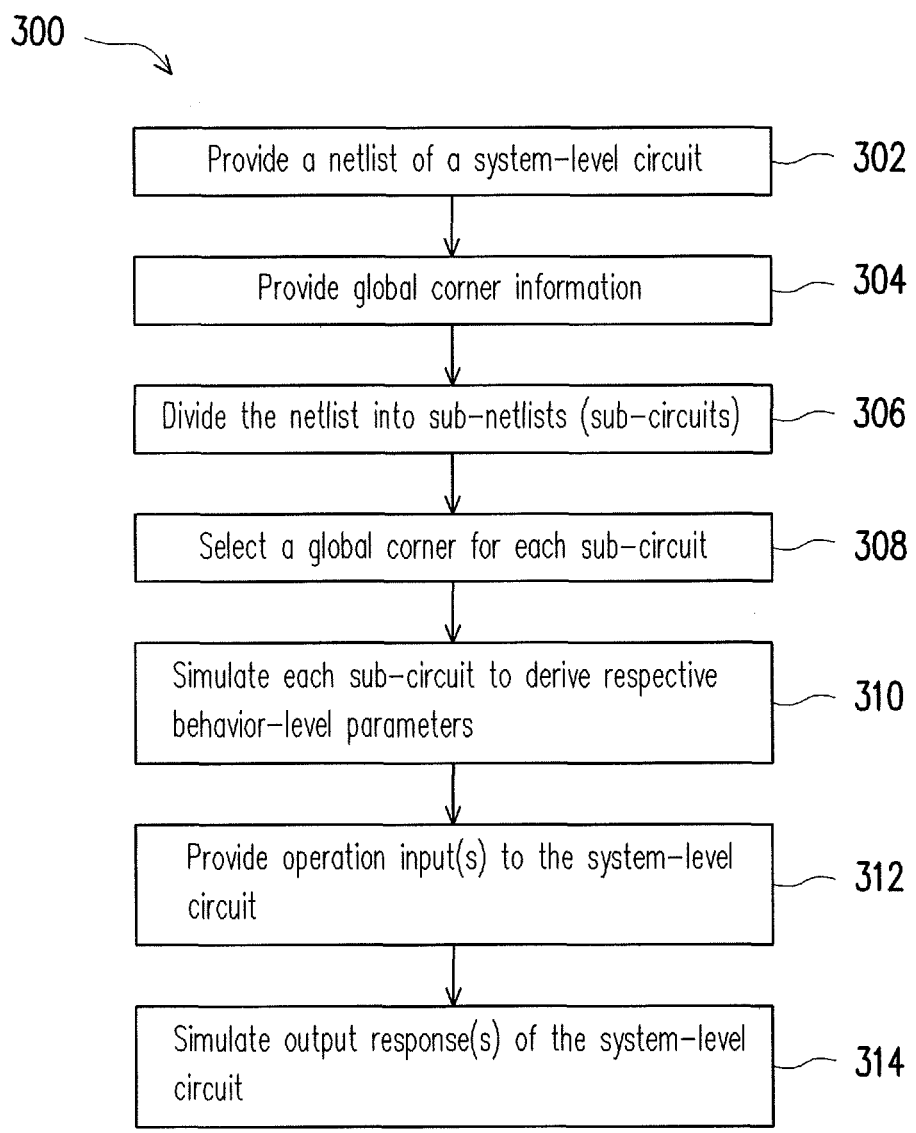
FIG. 3 illustrates a flow chart of a method to simulate a system-level circuit with consideration one or more global corners, in accordance with some embodiments.

FIG. 3 is a flow chart of a method 300 to incorporate one or more global corners into behavior-level parameter(s) of each sub-circuit of a system-level circuit so as to allow a system-level circuit to be simulated with consideration of the local mismatch variations, according to some embodiments of the present disclosure. In various embodiments, the operations of the method 300 are performed by the respective components illustrated in FIGS. 1-2. For purposes of discussion, the following embodiment of the method 300 will be described in conjunction with FIGS. 1-2. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which a netlist of a system-level circuit is provided to the global variation engine 144, in accordance with various embodiments. As described above, the netlist may be stored in and provided by the schematic design and cell information 122 of medium 120 (FIG. 1). In some embodiments, the system-level circuit may include a plurality of sub-circuits and accordingly, the netlist may include a plurality of sub-circuits inter-coupled with one another to provide one or more logic and/or analog functions that the system-level circuit is configured to perform. In some embodiments, during the operation 302, one or more parameters to operate the system-level circuit may also be provided by the schematic design and cell information 122 of medium 120.

The method 300 continues to operation 304 in which information of global corners is provided by the technology file 124 of the medium 120 and to the global variation engine 144, in accordance with various embodiments. As described above, the information of global corners may be provided by each foundry that fabricates the device/line constituting the sub-circuits and the system-level circuit. Using the five-corners (i.e., TT, SS, FF, SF, FS) as an example, each sub-circuit may be selected to operate under at least one corner, which will be discussed in further detail in the following operations.

The method 300 continues to operation 306 in which the netlist of the system-level circuit is divided into plural sub-netlists by the global variation engine 144, in accordance with various embodiments. More specifically, each sub-netlist corresponds to a respective sub-circuit. In some embodiments, the global variation engine 144 may access the behavioral model library 142 to determine (or select) a suitable behavioral model for each sub-circuit based on the functionalities/characteristic of the respective sub-circuit and an application of the system-level circuit. As such, in some embodiments, each selected behavioral model may include one or more functions described by respective behavior-level parameter(s), as described above with respect to FIG. 2. In some embodiments, the selected behavioral model may be used for the later use of simulating system-level output response(s) (which will be described below).

The method 300 continues to operation 308 in which each of the divided sub-circuit (at operation 306) is selected with a respective global corner by the global variation engine 144, in accordance with various embodiments. Using the PLL circuit 200 of FIG. 2 and the five-corner (i.e., TT, SS, FF, SF, FS) as an example, the PFD 202, the CP and LF 204, and the VCO 206 may be selected to operate under the SS corner, the SF corner, the SS corner, respectively.

The method 300 continues to operation 310 in which each sub-circuit is simulated at a device-level (or a transistor-level) using the selected global corner, in accordance with various embodiments. That is, each sub-circuit may be simulated at the device-level with the consideration of respective global corner. In some embodiments, at the operation 310, the global variation engine 144 may perform one or more device-level simulations (e.g., Simulation Program with Integrated Circuit Emphasis (SPICE)) on each of the sub-netlists using the selected global corner (at operation 308) to derive "global-variation-aware" behavior-level parameters for the respective sub-circuit.

Continuing with the above example, performing SPICE simulation(s) on the PFD 202 under the selected global corner (the SS corner) may cause the PFD 202 to have a corresponding set of behavior-level parameters at the SS corner; performing SPICE simulation(s) on the CP and LF 204 under the selected global corner (the SF corner) may cause the CP and LF 204 to have a corresponding set of behavior-level parameters at the SF corner; performing SPICE simulation(s) on the VCO 206 under the selected global corner (the SS corner) may cause the VCO 206 to have a corresponding set of behavior-level parameters at the SS corner.

It is noted that once the behavioral model (i.e., the function described by respective behavior-level parameter(s)) of each sub-circuit is determined (at the operation 306), the function may not be changed. However, depending on the global corner being selected (at the operation 308), values of the behavior-level parameter(s) may vary accordingly. In other words, each sub-circuit's behavioral input(s)/output(s) may vary with own behavior-level parameter(s), and also with the sub-circuit's coupled sub-circuits' behavior-level parameter(s) (in turn, the respective behavioral input(s)/output(s)).

The method 300 continues to operation 312 in which one or more system-level operation inputs are provided to simulate system-level output response(s), in accordance with various embodiments. In some embodiments, the global variation engine 144 may retrieve the system-level operation inputs from the schematic design and cell information 122 of medium 120. The system-level operation input may include a digital signal, an analog signal, and/or a combination thereof.

The method 300 continues to operation 314 in which the system-level output response(s) is derived by using the system-level operation inputs, and each sub-circuit's behavioral input(s) and output(s), in accordance with various embodiments. In some embodiments, the operation 314 may be performed by the global variation engine 144. To recap, at the operation 306, each sub-circuit is designated with a behavioral model (i.e., a function described by using respective behavior-level parameters), and at the operation 310, each sub-circuit is simulated to determine values of respective behavior-level parameters at the selected global corner. Accordingly, at the operation 314, each sub-circuit may receive one or more behavioral inputs, use the designated behavioral model with respective behavior-level parameters, and to output one or more corresponding behavioral output(s). And associating the plural behavioral inputs and outputs with one another, based on the netlist (the design of the system-level circuit), may make the system-level output response(s) readily available. As such, with simultaneously considering the variation(s) (e.g., the global corners), the system-level circuit can still be simulated at a higher level, which advantageously reduce simulation time/cost.

Continuing using the above example, when the (system-level operation) input 201 is provided to the PFD 202, the global variation engine 144 uses the PFD 202's designated behavioral model and respective behavior-level parameters at the SS corner to provide behavioral output 203. Then the global variation engine 144 uses the behavioral output 203 as the CP and LF 204's behavioral input. Further, the global variation engine 144 uses the CP and LF 204's designated behavioral model and respective behavior-level parameters at the SF corner to provide behavioral output 205. Similarly, the global variation engine 144 uses the behavioral output 205 as the VCO 206's behavioral input and the VCO 206's designated behavioral model and respective behavior-level parameters at the SS corner to provide behavioral output 207. In some embodiments, the behavioral output 203 of the PFD 202 (in response to the input 201 of the PFD 202), the behavioral output 205 of the CP and LF 204 (in response to the input 203 of the CP and LF 204), and/or the behavioral output 207 of the VCO 206 (in response to the input 205 of the VCO 206) may each serve as one of the system-level output response(s).

Alternatively or additionally, in some embodiments, during the operation 314, one or more sub-circuits may be selected to be simulated without using respective behavior-level parameters. Instead, such one or more sub-circuits may be simulated at the selected global corner, using the transistor-level simulations, to produce respective behavioral output(s). As such, the produced respective behavioral output(s) may have higher accuracy.

Figure 4:
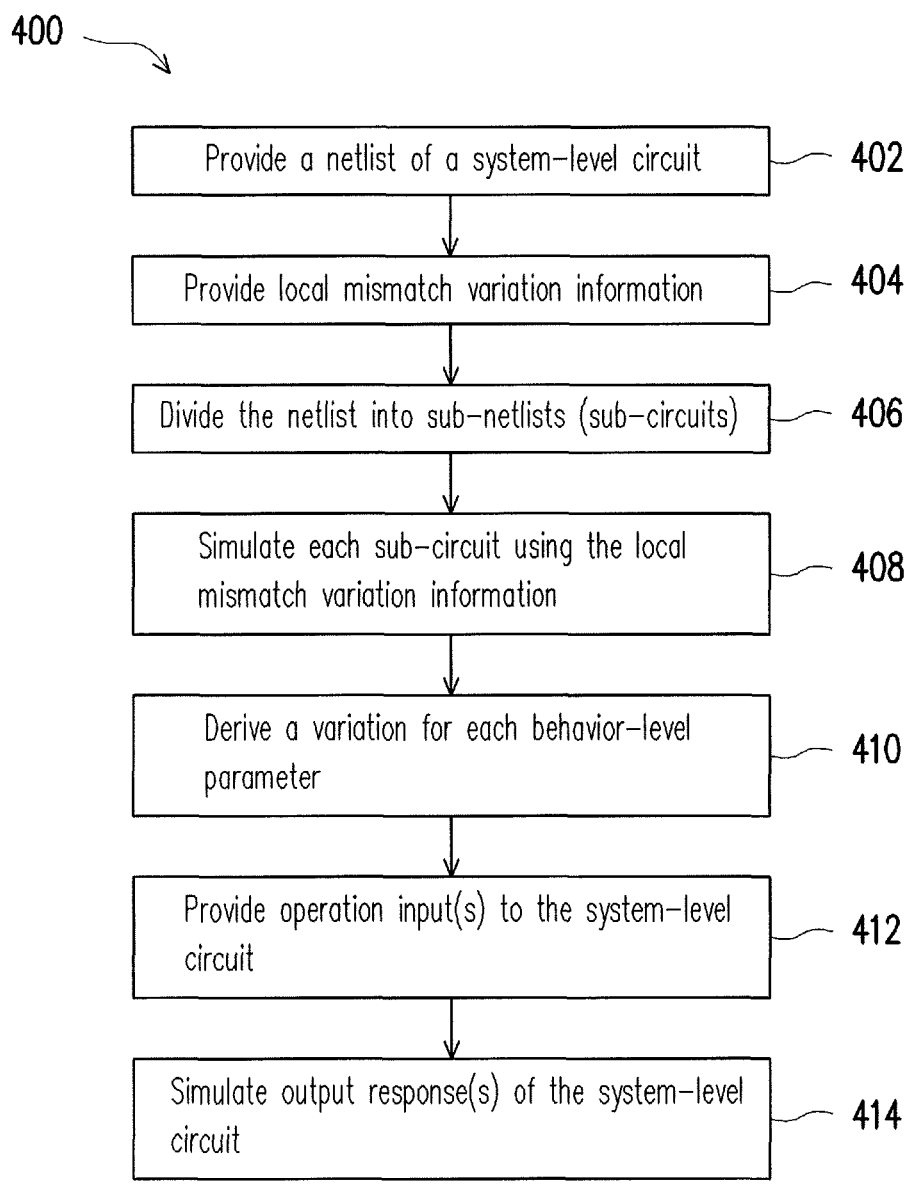
FIG. 4 illustrates a flow chart of a method to simulate a system-level circuit with consideration one or more local mismatch variations, in accordance with some embodiments.

FIG. 4 is a flow chart of a method 400 to incorporate local mismatch variations into behavior-level parameter(s) of each sub-circuit of a system-level circuit so as to allow a system-level circuit to be simulated with consideration of the local mismatch variations, according to some embodiments of the present disclosure. In various embodiments, the operations of the method 400 are performed by the respective components illustrated in FIGS. 1-2. For purposes of discussion, the following embodiment of the method 400 will be described in conjunction with FIGS. 1-2. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which a netlist of a system-level circuit is provided to the local variation engine 146, in accordance with various embodiments. As described above, the netlist may be stored in and provided by the schematic design and cell information 122 of medium 120 (FIG. 1). In some embodiments, the system-level circuit may include a plurality of sub-circuits and accordingly, the netlist may include a plurality of sub-circuits inter-coupled with one another to provide one or more logic and/or analog functions that the system-level circuit is configured to perform. In some embodiments, during the operation 402, one or more parameters to operate the system-level circuit may also be provided by the schematic design and cell information 122 of medium 120.

The method 400 continues to operation 404 in which information of local mismatch variations is provided by the technology file 124 of the medium 120 and to the local variation engine 146, in accordance with various embodiments. As described above, the information of local mismatch variations may be provided by each foundry that fabricates the device/line constituting the sub-circuits and the system-level circuit. In some embodiments, the local mismatch variation generally includes a set of variations for each type of line and/or device, at a particular technology node, wherein each variation is described as a probability distribution and each probability distribution corresponds to a variation of a design parameter (e.g., a channel width, a channel length, a gate oxide thickness, etc.) or a device characteristic (e.g., a threshold voltage).

In an example, for a device such as a first MOSFET of a sub-circuit, the local mismatch variations of the first MOSFET may include four variations (i.e., four probability distributions). More specifically, these four may represent a probability distribution of the first MOSFETs channel width, a probability distribution of the first MOSFET's channel length, a probability distribution of the first MOSFET's gate oxide thickness, a probability distribution of the first MOSFETs threshold voltage, respectively. For a second MOSFET of the sub-circuit, the local mismatch variations of the second MOSFET may include four probability distributions that represent variations of the second MOSFETs channel width, channel length, gate oxide thickness, and threshold voltage, respectively.

In some embodiments, as described above, some of the local mismatch variations may not have physical meaning and are only for statistic purpose. As such, continuing using the above example, the local mismatch variations of the first MOSFET of the sub-circuit may include a finite number (e.g., 3~10) of probability distributions wherein each probability distribution represent a non-physical statistic variable.

The method 400 continues to operation 406 in which the netlist of the system-level circuit is divided into plural sub-netlists by the local variation engine 146, in accordance with various embodiments. More specifically, each sub-netlist corresponds to a respective sub-circuit. In some embodiments, the local variation engine 146 may access the behavioral model library 142 to determine (or select) a suitable behavioral model for each sub-circuit based on the functionalities/characteristic of the respective sub-circuit and an application of the system-level circuit. As such, in some embodiments, each selected behavioral model may include one or more functions described by respective behavior-level parameter(s), as described above with respect to FIG. 2. In some embodiments, the selected behavioral model may be used for the later use of simulating system-level output response(s) (which will be described below).

In accordance with various embodiments, the method 400 continues to operation 408 in which each sub-circuit is simulated, by the local variation engine 146, using the local mismatch variations of each of the respective devices/lines included (in the sub-circuit) so as to derive plural sets of probability distributions, wherein each set of the probability distributions corresponds to a respective device's/line's variations. More specifically, in some embodiments, each of the simulations at the operation 408 may be derived by performing at least one Monte Carlo simulation. In general, the Monte Carlo simulation receives plural inputs that are randomly generated from a first probability distribution, performs a deterministic computation on the inputs to provide plural outputs, and aggregates the outputs as a second probability distribution.

Referring again to FIG. 2 and using the PLL circuit 200 as an example, the PFD 202 may include seven transistors. As mentioned above, each transistor includes four local mismatch variations: a probability distribution of the respective channel width, a probability distribution of the respective channel length, a probability distribution of the respective gate oxide thickness, and a probability distribution of the respective threshold voltage. Using one or more Monte Carlo simulations, each transistor of the PFD 202's may include a respective set of probability distributions (corresponding to the transistor's respective variations), wherein each probability distribution corresponds to the variation of the channel length, channel width, gate oxide thickness, and threshold voltage. In some embodiments, the local variation engine 146 may select one or more variations for each transistor. In the above example, the local variation engine 146 may select the threshold voltage variation (i.e., the probability distribution of the threshold voltage) for each of the transistors of the PFD 202.

The method 400 continues to operation 410 in which a variation of each behavior-level parameter in the respective behavioral model (the respective sub-circuit) is derived by the local variation engine 146 using the variation(s) of each device/line included in the sub-circuit, in accordance with various embodiments. More specifically, the variation of each behavior-level parameter may be derived by any of a variety of curve/surface fitting techniques. Consequently, each behavior-level parameter of the respective sub-circuit may also be described as a probability distribution that is a function of the respective local mismatch variation(s) (i.e., the local mismatch variations of the respective devices/lines included in that sub-circuit). For example, the VCO 206 (FIG. 2) may include three transistors, and each transistor includes a respective threshold voltage variation (i.e., a Monte Carlo variable): $Vth_1$, $Vth_2$, and $Vth_3$. It is noted that each variation is a probability distribution of the respective Monte Carlo variable. Based on a first order polynomial equation, the gain of the VCO 206 (i.e., one of the VCO 206's behavior-level parameters) may be represented as, $a_1 \times Vth_1 + a_2 \times Vth_2 + a_3 \times Vth_3$. Using one or more curve-fittings, coefficients $a_1$, $a_2$, and $a_3$ may be derived, and, as such, the gain of the VCO 206 is linked with the respective threshold voltage variations.

It is noted that once the behavioral model (i.e., the function described by respective behavior-level parameter(s)) of each sub-circuit is determined (at the operation 406), the function may not be changed. However, after the operation 410, each of the behavior-level parameters is a function of at least one of the local mismatch variations. In other words, each sub-circuit's behavioral input(s)/output(s) may be a function of the at least one of the local mismatch variations.

The method 400 continues to operation 412 in which one or more system-level operation inputs are provided to simulate system-level output response(s), in accordance with various embodiments. In some embodiments, the local variation engine 146 may retrieve the system-level operation inputs from the schematic design and cell information 122 of medium 120. The system-level operation input may include a digital signal, an analog signal, and/or a combination thereof.

The method 400 continues to operation 414 in which the system-level output response(s) is derived by using the system-level operation inputs, and each sub-circuit's behavioral input(s) and output(s), in accordance with various embodiments. In some embodiments, the operation 414 may be performed by the local variation engine 146. To recap, at the operation 406, each sub-circuit is designated with a behavioral model (i.e., a function described by using respective behavior-level parameters), and at the operation 410, each sub-circuit's behavior-level parameter(s) with consideration of at least one of the local mismatch variations are derived. Accordingly, at the operation 414, each sub-circuit may receive one or more behavioral inputs, use the designated behavioral model with respective behavior-level parameters (as a function of local mismatch variation(s)), and to output one or more corresponding behavioral output(s). Similar to the operation 314 of FIG. 3, associating the plural behavioral inputs and outputs with one another, based on the netlist (the design of the system-level circuit), may make the system-level output response(s) readily available. As such, with simultaneously considering the variation(s) (e.g., the local mismatch variations), the system-level circuit can still be simulated at a higher level, which advantageously reduce simulation time/cost.

In an embodiment, an integration circuit (IC) simulation method includes: (a) providing a design netlist of a system-level circuit, wherein the system-level circuit comprises a first sub-circuit; (b) providing a first behavior model that is determined based on an operation of the first sub-circuit, wherein the first behavior model is a function of one or more respective behavior-level parameters; (c) incorporating a first variation into each of the one or more behavior-level parameters of the first behavioral model; and (d) simulating the system-level circuit based on the one or more behavior-level parameters of the first behavior model that incorporates the first variation.

In another embodiment, a system includes a non-transitory memory configured to store a design netlist of a system-level circuit, wherein the system-level circuit comprises a first sub-circuit, and one or more hardware processors in communication with the non-transitory memory. The one or more processors are configured to: (a) receive the design netlist; (b) receive a first behavior model that is determined based on an operation of the first sub-circuit, wherein the first behavior model is a function of one or more respective behavior-level parameters; (c) incorporate a first variation into each of the one or more behavior-level parameters of the first behavioral model; and (d) simulate the system-level circuit based on the one or more behavior-level parameters of the first behavior model that incorporates the first variation.

Yet in another embodiment, a system includes a non-transitory memory configured to store a design netlist of a system-level circuit, wherein the system-level circuit comprises first and second sub-circuits, and one or more hardware processors in communication with the non-transitory memory. The one or more processors are configured to: (a) receive the design netlist; (b) receive a first behavior model that is determined based on an operation of the first sub-circuit and a second behavior model that is determined based on an operation of the second sub-circuit, wherein the first behavior model is a function of a first plurality of behavior-level parameters and the second behavior model is a function of a second plurality of behavior-level parameters; (c) incorporate a first variation into each of the first and second pluralities of behavior-level parameters; and (d) simulate the system-level circuit based on the first and second pluralities of behavior-level parameters.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integration circuit (IC) simulation method, comprising:
   (a) providing a design netlist of a system-level circuit, wherein the system-level circuit comprises a first sub-circuit;
   (b) providing a first behavior model that is determined based on an operation of the first sub-circuit, wherein the first behavior model is a function of one or more respective behavior-level parameters;
   (c) incorporating a first variation into each of the one or more behavior-level parameters of the first behavior model; and
   (d) simulating the system-level circuit based on the one or more behavior-level parameters of the first behavior model that incorporates the first variation, wherein the first variation comprises at least one first local mismatch variation, wherein the at least one first local mismatch variation corresponds to a variation of a design parameter of an element of the first sub-circuit.

2. The IC simulation method of claim 1, wherein the first variation further comprises a process-voltage-temperature corner.

3. The IC simulation method of claim 1, wherein the step (d) comprises performing a transistor-level simulation on the first sub-circuit with the use of the first variation.

4. The IC simulation method of claim 1, further comprising (e) using the first behavior model and the one or more behavior-level parameters of the first behavior model that incorporates the first variation to provide a behavior output.

5. The IC simulation method of claim 1, wherein the system-level circuit comprises a second sub-circuit.

6. The IC simulation method of claim 5, wherein the step (b) further comprises:
   providing a second behavior model that is determined based on an operation of the second sub-circuit, wherein the second behavior model is a function of one or more respective behavior-level parameters.

7. The IC simulation method of claim 6, wherein the step (c) further comprises:
   providing a second variation, wherein the second variation comprises at least one second local mismatch variation, wherein the at least one second local mismatch variation corresponds to a variation of a design parameter of an element of the second sub-circuit.

8. The IC simulation method of claim 7, wherein the second variation is different from the first variation.

9. The IC simulation method of claim 7, wherein the second variation is identical to the first variation.

10. The IC simulation method of claim 7, wherein the step (c) further comprises:
    incorporating the second variation into each of the one or more behavior-level parameters of the second behavior model.

11. The IC simulation method of claim 10, wherein the step (d) comprises:
    simulating the system-level circuit based on the one or more behavior-level parameters of the first behavior model that incorporates the first variation and the one or more behavior-level parameters of the second behavior model that incorporates the second variation, respectively.

12. The IC simulation method of claim 11, wherein the step (d) further comprises:
    using the second behavior model and the one or more behavior-level parameters of the second behavior model that incorporates the second variation to provide a behavior output;
    providing the behavior output to the first behavior model as a behavior input so as to simulate the first sub-circuit by using the behavioral input, the first behavior model, and the one or more behavior-level parameters that incorporates the first variation.

13. A system comprising:
    a non-transitory memory configured to store a design netlist of a system-level circuit, wherein the system-level circuit comprises a first sub-circuit; and
    one or more hardware processors in communication with the non-transitory memory and configured to:
    (a) receive the design netlist;
    (b) receive a first behavior model that is determined based on an operation of the first sub-circuit, wherein the first behavior model is a function of one or more respective behavior-level parameters;
    (c) incorporate a first variation into each of the one or more behavior-level parameters of the first behavior model; and
    (d) simulate the system-level circuit based on the one or more behavior-level parameters of the first behavior model that incorporates the first variation, wherein the first variation comprises at least one first local mismatch variation, wherein the at least one first local mismatch variation corresponds to a variation of a design parameter of an element of the first sub-circuit.

14. The system of claim 13, wherein the first variation further comprises at least one of process-voltage-temperature corners.

15. The system of claim 13, wherein, at the step (c), the one or more hardware processors are further configured to perform a transistor-level simulation on the first sub-circuit with the use of the first variation.

16. The system of claim 13, wherein, at the step (d), the one or more hardware processors are further configured to use the first behavior model and the one or more behavior-level parameters of the first behavior model that incorporates the first variation to provide a behavioral output.

17. A system comprising:
    a non-transitory memory configured to store a design netlist of a system-level circuit, wherein the system-level circuit comprises first and second sub-circuits; and
    one or more hardware processors in communication with the non-transitory memory and configured to:
    (a) receive the design netlist;
    (b) receive a first behavior model that is determined based on an operation of the first sub-circuit and a second behavior model that is determined based on an operation of the second sub-circuit, wherein the first behavior model is a function of a first plurality of behavior-level parameters and the second behavior model is a function of a second plurality of behavior-level parameters;
    (c) incorporate a first variation into each of the first and second pluralities of behavior-level parameters; and
    (d) simulate the system-level circuit based on the first and second pluralities of behavior-level parameters, wherein the first variation comprises at least one first local mismatch variation, wherein the at least one first local mismatch variation corresponds to a variation of a design parameter of an element of the first sub-circuit and the second-sub-circuit.

18. The system of claim 17, wherein the first variation further comprises at least one of process-voltage-temperature corners.

19. The system of claim 17, wherein, at the step (c), the one or more hardware processors are further configured to:
    receive a second variation that is different from the first variation, wherein the second variation comprises at least one second local mismatch variation, wherein the at least one second local mismatch variation corresponds to a variation of a design parameter of an element of the second sub-circuit.

20. The system of claim 19, at the step (c), the one or more hardware processors are further configured to:
    incorporate the first and second variation into each of the first and second pluralities of behavior-level parameters, respectively.

* * * * *